United States Patent
Alyamani et al.

(10) Patent No.: US 7,206,983 B2
(45) Date of Patent: Apr. 17, 2007

(54) SEGMENTED ADDRESSABLE SCAN ARCHITECTURE AND METHOD FOR IMPLEMENTING SCAN-BASED TESTING OF INTEGRATED CIRCUITS

(75) Inventors: Ahmad A. Alyamani, Santa Clara, CA (US); Mikhail I. Grinchuk, San Jose, CA (US); Erik Chmelar, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 237 days.

(21) Appl. No.: 11/097,936

(22) Filed: Mar. 31, 2005

(65) Prior Publication Data

US 2006/0236176 A1 Oct. 19, 2006

(51) Int. Cl.
*G01R 31/28* (2006.01)
(52) U.S. Cl. ................. 714/729; 714/727
(58) Field of Classification Search ........... 716/2, 716/18; 714/726, 728, 736, 729, 727
See application file for complete search history.

(56) References Cited

U.S. PATENT DOCUMENTS

| | | | | |
|---|---|---|---|---|
| 5,155,732 A * | 10/1992 | Jarwala et al. | ............... | 714/726 |
| 5,828,579 A * | 10/1998 | Beausang | ................ | 716/2 |
| 5,949,692 A * | 9/1999 | Beausang et al. | ............. | 716/18 |
| 6,041,429 A | 3/2000 | Koenemann | ................ | 714/738 |
| 6,370,664 B1 * | 4/2002 | Bhawmik | ................. | 714/729 |
| 6,499,124 B1 * | 12/2002 | Jacobson | .................. | 714/727 |
| 6,615,380 B1 * | 9/2003 | Kapur et al. | ................ | 714/738 |
| 2004/0153978 A1 | 8/2004 | Xiang et al. | .................. | 716/3 |

OTHER PUBLICATIONS

"LFSR-Coded Test patterns for Scan Designs," by Dr. Bernd Konemann; c/o IBM Corp., B56/901, P.O. Box 390, Poughkeepsie, NY 12533; European Test Conference (ETC'91); pp. 237-242; 1991.
"Seed Encoding with LFSRs and Cellular Automata," by Ahmad A. Al-Yamani and Edward J. McCluskey; Center for Reliable Computing, Stanford University, Stanford, CA; 40th Design Automation Conference (DAC 2003); pp. 560-565; Jun. 2-6, 2003, Anaheim, CA; © 2003.
"CircularScan: A Scan Architecture for Test Cost Reduction," by Baris Arslan and Alex Orailoglu; Computer Science and Engineering Department, University of California, San Diego, La Jolla, CA 92093; Design, Automation and Test in Europe Conference and Exhibition (DATE '04), vol. 2, pp. 1290-1295 (6 pages), Feb. 2004; © 2004.
"Broadcasting Test Patterns to Multiple Circuits," by Kuen-Jong Lee, Jih-Jeen Chen, and Cheng-Hua Huang; IEEE Transactions on Computer-Aided Design (TCAD) of Integrated Circuits and Systems, vol. 18, No. 12, pp. 1793-1802; Dec. 1999; © 1999.

(Continued)

*Primary Examiner*—David Ton
(74) *Attorney, Agent, or Firm*—Suiter Swantz PC LLO

(57) ABSTRACT

The present invention provides a segmented addressable scan architecture and method for implementing scan-based testing of integrated circuits. A scan chain is divided into a plurality of segments. For a test pattern, compatible segments of the plurality of segments are grouped into compatibility classes. All compatible segments or a subset of them within one of the compatibility classes are simultaneously loaded through selective activation.

24 Claims, 14 Drawing Sheets

OTHER PUBLICATIONS

"Reducing Test Application Time for Full Scan Embedded Cores," by Ilker Hamzaoglu and Janak H. Patel; Center for Reliable & High-Performance Computing, University of Illinois, Urbana, IL 61801; IEEE International Symposium on Fault Tolerant Computing (FTC '99), pp. 260-267 (8 pages), 1999.

"BIST-Aided Scan Test—A New Method for Test Cost Reduction," by Takahisa Hiraide, Kwame Osei Boateng, Hideaki Konishi, Koichi Itaya, Michiaki Emori, Hitoshi Yamanaka, Takashi Mochiyama; Fujitsu Laboratories Ltd.; IEEE VLSI Test Symposium (VTS '03), pp. 359-364 (6 pages), Apr. 2003, © 2003.

"A Token Scan Architecture for Low Power Testing," by Tsung-Chu Huang and Kuen-Jong Lee; Department of Electrical Engineering, National Cheng Kung University, Tainan, Taiwan 70101, R.O.C.; International Test Conference (ITC '01); pp. 660-669; Oct. 2001; © 2001.

"Test Data Compression," by Edward J. McCluskey, Dwayne Burek, Bernd Koenemann, Subhasish Mitra, Janak Patel, Janusz Rajski, and John Waicukauski; ITC 2002 Roundtable; Design & Test of Computers, vol. 20, No. 2, pp. 76-87, Mar.-Apr. 2003; © 2003.

"Embedded Deterministic Test," by Janusz Rajski, Jerzy Tyszer, Mark Kassab, and Nilanjan Mukherjee; IEEE Transactions on Computer-Aided Design (TCAD) of Integrated Circuits and Systems, vol. 23, No. 5, pp. 776-792, May 2004; © 2004.

"Scan Architecture with Mutually Exlusive Scan Segment Activation for Shift- and Capture-Power Reduction," by Paul Rosinger, Bashir M. Al-Hashimi, and Nicola Nicolici; IEEE Transactions on Computer-Aided Design (TCAD) of Integrated Circuits and Systems, vol. 23, No. 7, pp. 1142-1153, Jul. 2004, © 2004.

"A Reconfigurable Shared Scan-in Architecture," by Samitha Samaranayake, Emil Gizdarski, Nodari Sitchinava, Frederic Neuveux, Rohit Kapur, and T.W. Williams; VLSI Test Symposium (VTS '03), Apr. 2003; 6 pages; © 2003.

"Reducing Test Power, Time and Data Volume in SoC Testing Using Selective Trigger Scan Architecture," by Shervin Sharifi, Mohammad Hosseinabadi, Pedram Riahi and Zainalabedin Navabi; Electrical and Computer Engineering, University of Tehran; 14399 Tehran, Iran, and Northeastern University, Boston, Massachusetts 02115; International Symposium on Defect and Fault Tolerance in VLSI Systems (DFT '03); 9 pages, © 2003.

"A Novel Scan Architecture for Power-Efficient, Rapid Test," by Ozgur Sinanoglu and Alex Orailoglu; Computer Science and Engineering Department, University of California, San Diego, La Jolla, CA 92093; International Conference on Computer-Aided Design (ICCAD '02), pp. 299-303, Nov. 2002; © 2002.

* cited by examiner

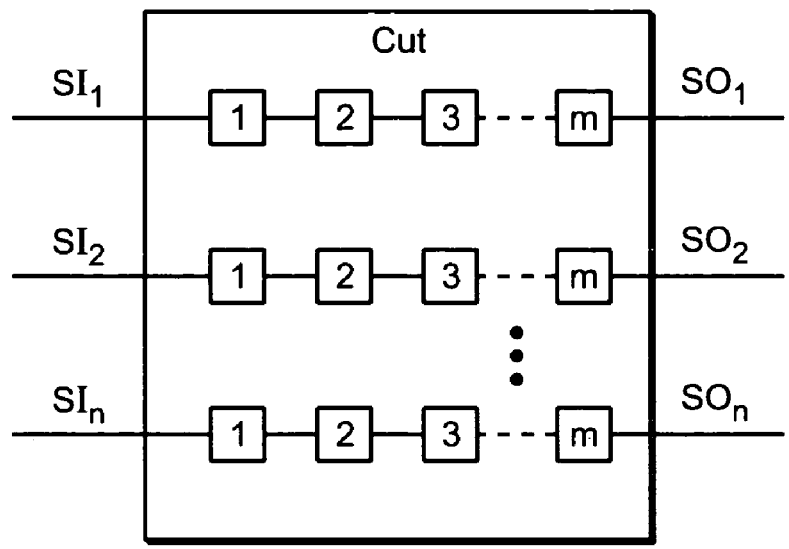
FIG._1
*(PRIOR ART)*
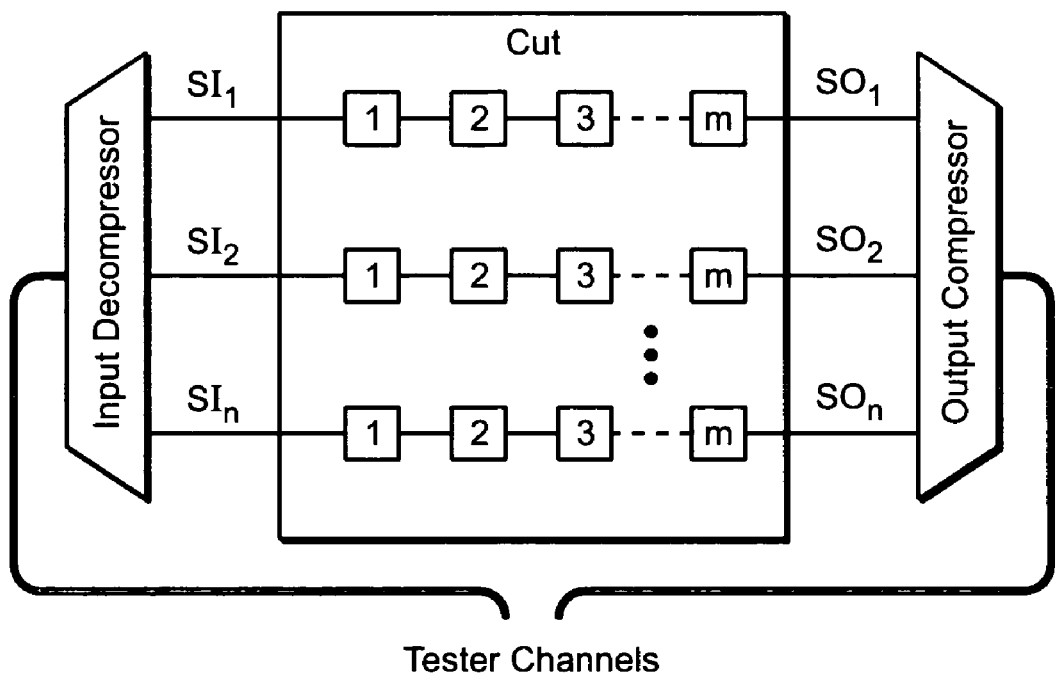
Tester Channels
FIG._2
*(PRIOR ART)*

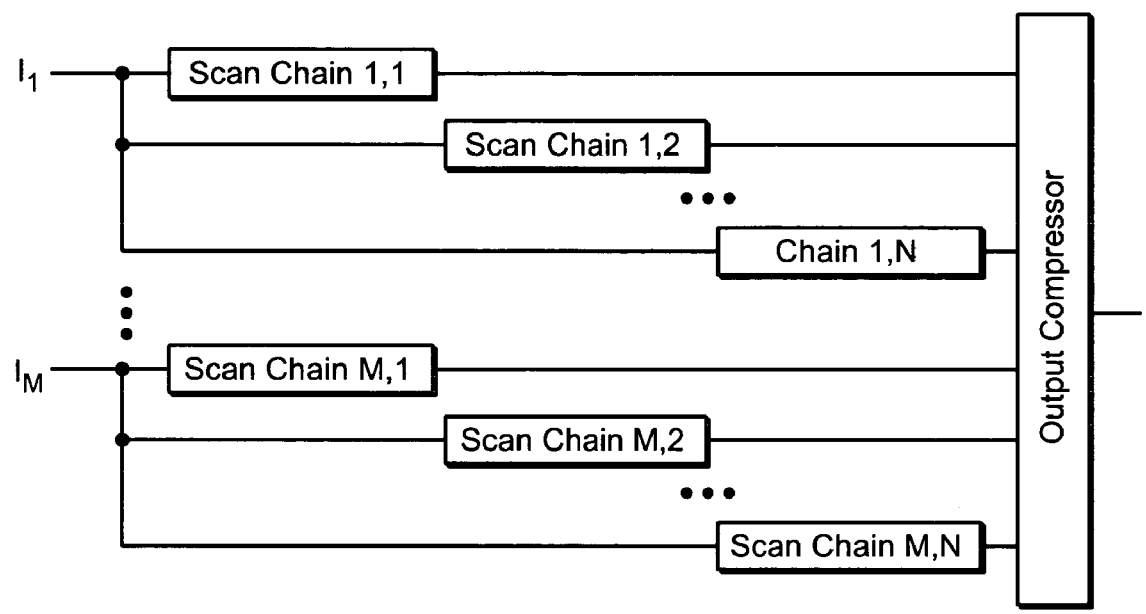
FIG._3
*(PRIOR ART)*
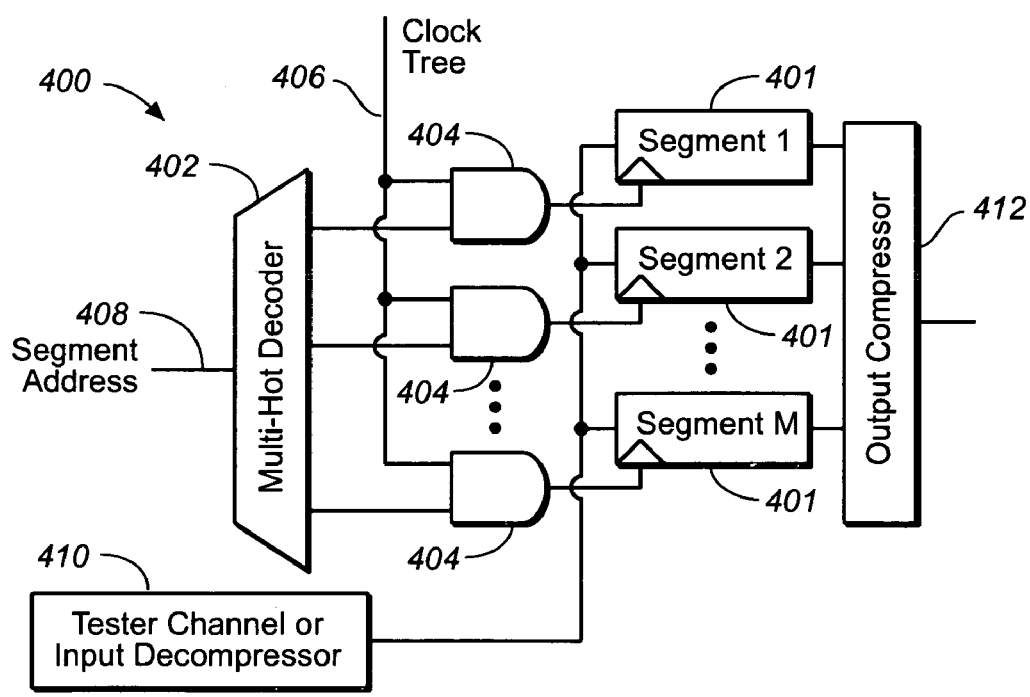
FIG._4

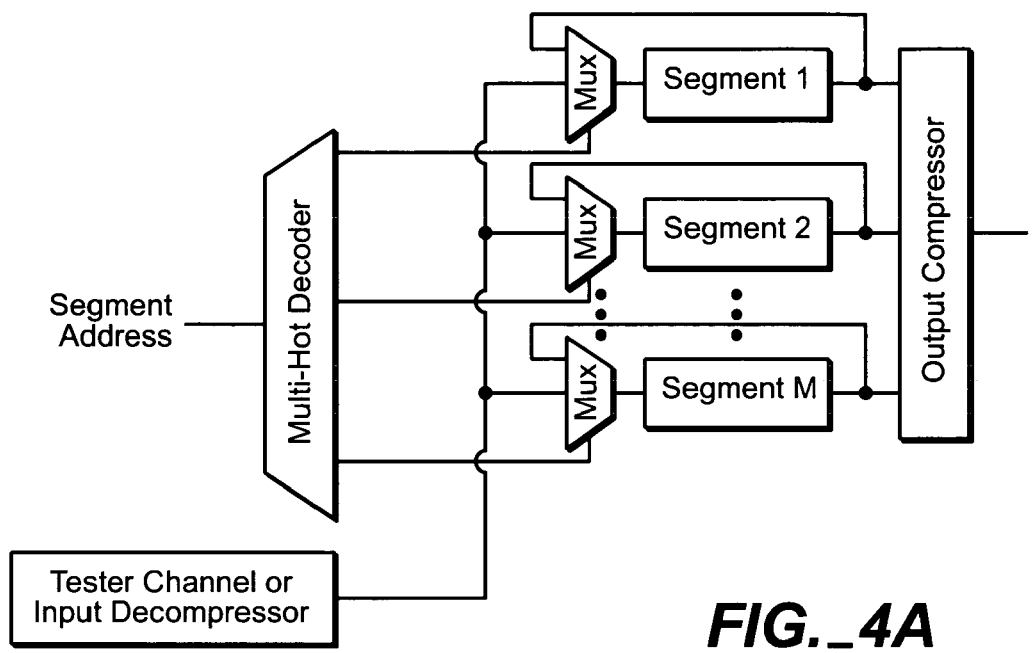
FIG._4A
Pattern:
0X11XXX0110X0XX101X1X11X0X011X
Segment 1:   0X11X
Segment 2:   XX011
Segment 3:   0X0XX
Segment 4:   101X1
Segment 5:   X11X0
Segment 6:   X011X
FIG._5
Class 1 = {Segment 1, Segment 5}
      = 01110
Class 2 = {Segment 2, Segment 3}
      = 0X011
Class 3 = {Segment 4, Segment 6}
      = 10111
FIG._6
| Code | Value |
|------|-------|
| 10 | 0 |
| 01 | 1 |
| 11 | d |
| 00 | Unused |
FIG._7

| Inputs | | | | Outputs | | | |
|---|---|---|---|---|---|---|---|
| $I_1$ | | $I_0$ | | $O_3$ | $O_2$ | $O_1$ | $O_0$ |
| a | b | c | d | | | | |
| 0 | 0 | 0 | 0 | X | X | X | X |
| 0 | 0 | 0 | 1 | X | X | X | X |
| 0 | 0 | 1 | 0 | X | X | X | X |
| 0 | 0 | 1 | 1 | X | X | X | X |
| 0 | 1 | 0 | 0 | X | X | X | X |
| 0 | 1 | 0 | 1 | 0 | 0 | 0 | 1 |
| 0 | 1 | 1 | 0 | 0 | 0 | 1 | 0 |
| 0 | 1 | 1 | 1 | 0 | 0 | 1 | 1 |
| 1 | 0 | 0 | 0 | X | X | X | X |
| 1 | 0 | 0 | 1 | 0 | 1 | 0 | 0 |
| 1 | 0 | 1 | 0 | 1 | 0 | 0 | 0 |
| 1 | 0 | 1 | 1 | 1 | 1 | 0 | 0 |
| 1 | 1 | 0 | 0 | X | X | X | X |
| 1 | 1 | 0 | 1 | 0 | 1 | 0 | 1 |
| 1 | 1 | 1 | 0 | 1 | 0 | 1 | 0 |
| 1 | 1 | 1 | 1 | 1 | 1 | 1 | 1 |
*FIG._8*
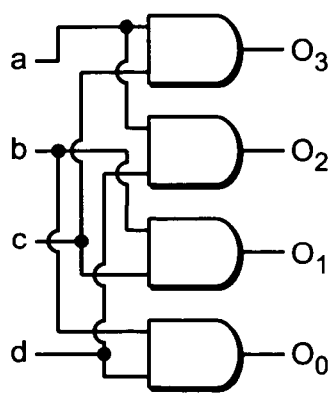
*FIG._9*

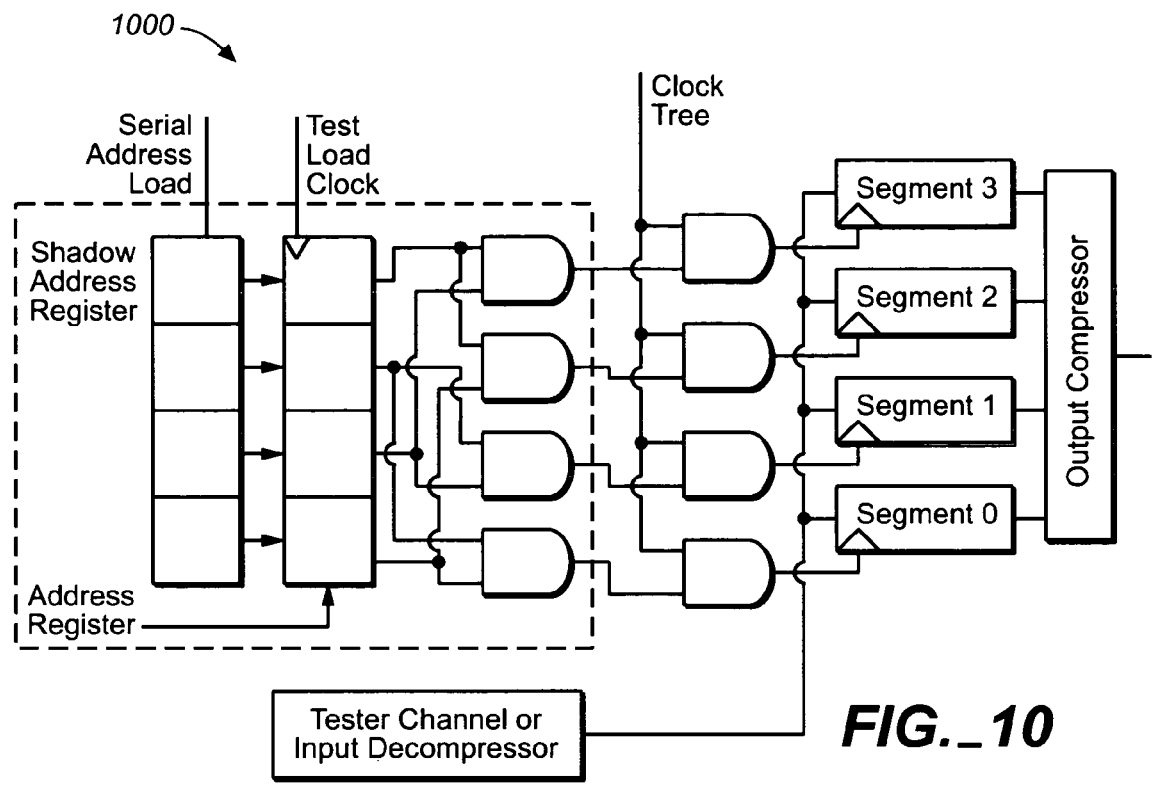
*FIG._10*
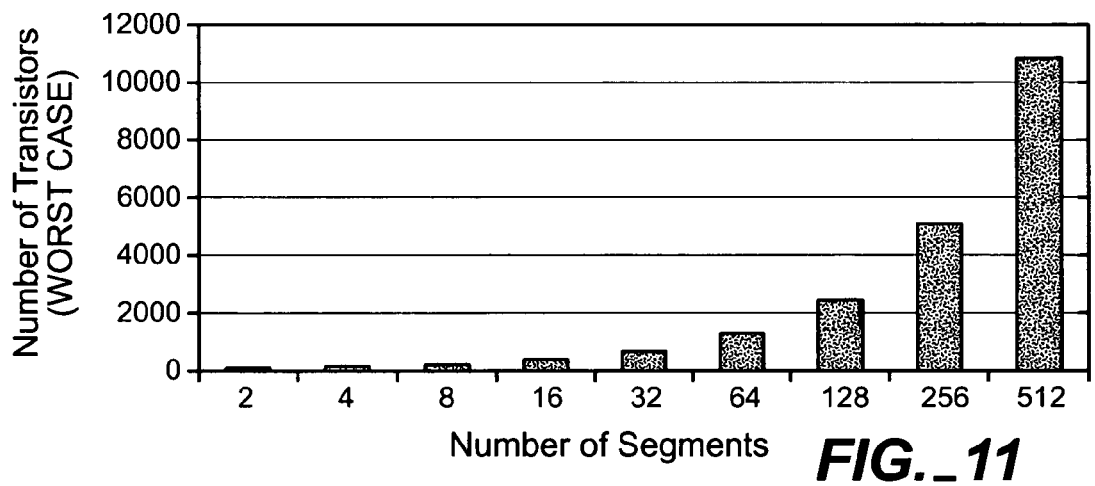
*FIG._11*
|  | Flip-Flops | Gate Count | PIs | POs | Test Patterns |
|---|---|---|---|---|---|
| Ckt1 | 544 | 6,732 | 61 | 64 | 132 |
| Ckt2 | 4,570 | 56,515 | 25 | 85 | 106 |
| Ckt3 | 1,359 | 19,188 | 44 | 59 | 1,383 |
*FIG._12*

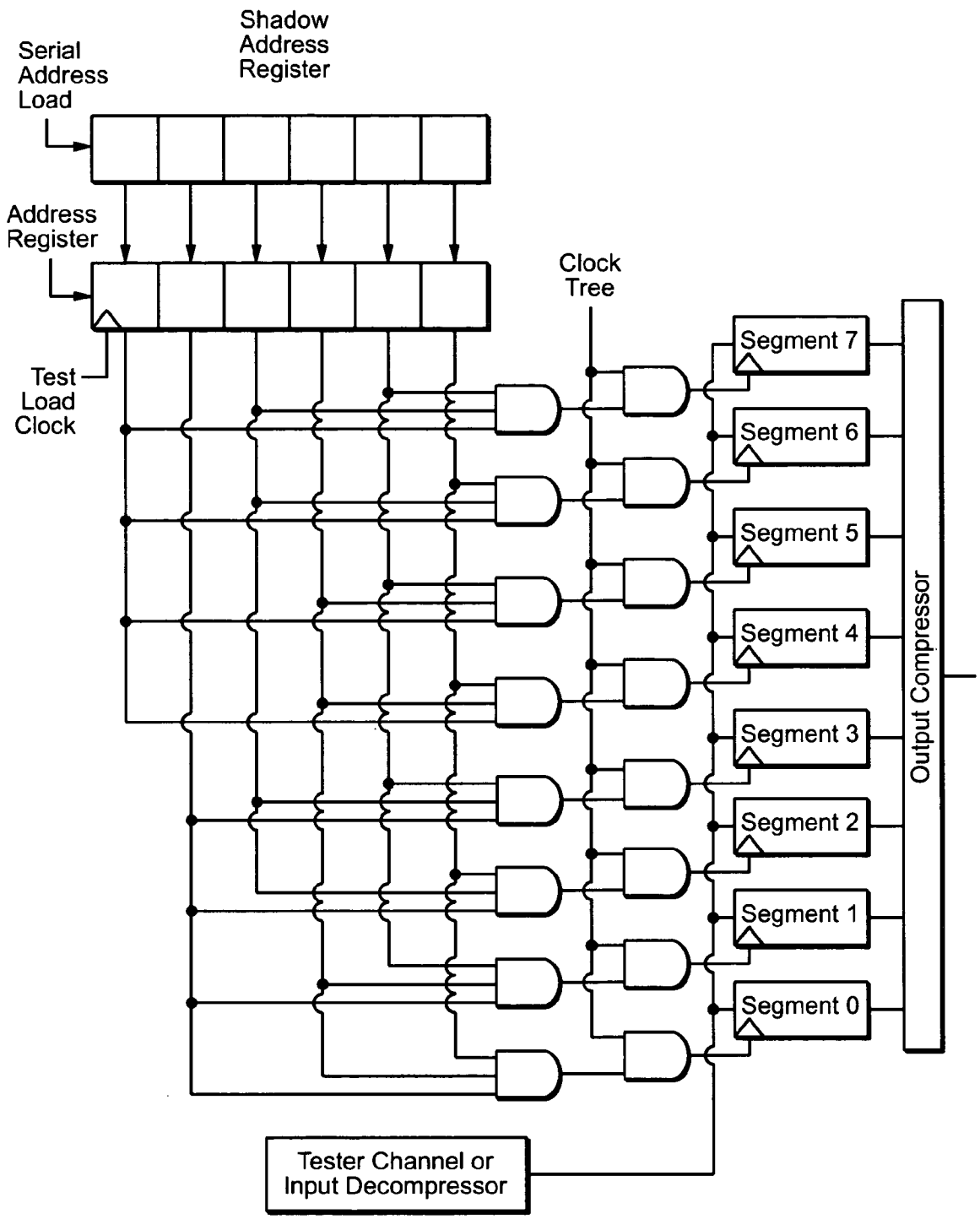
FIG._10A

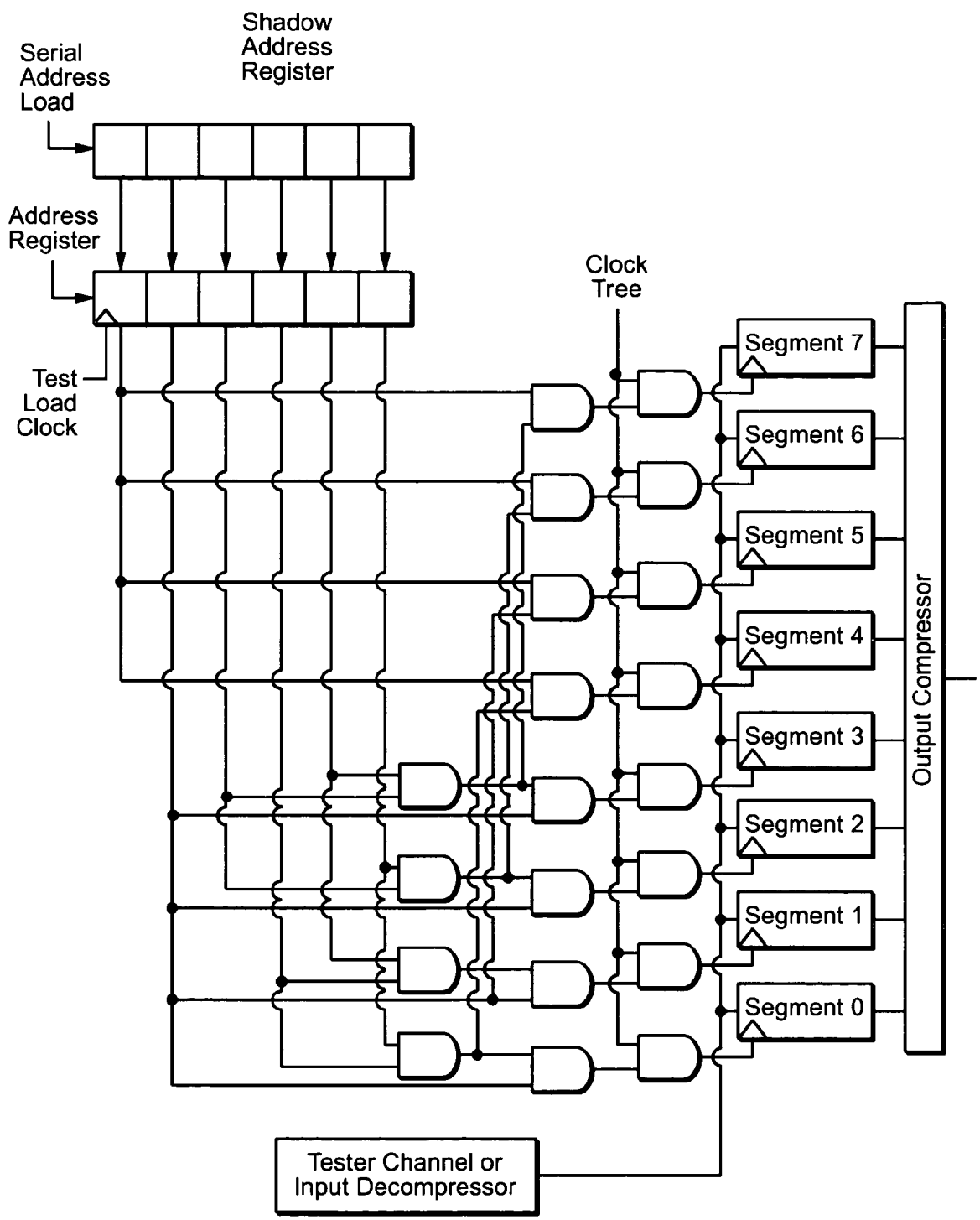
FIG._10B

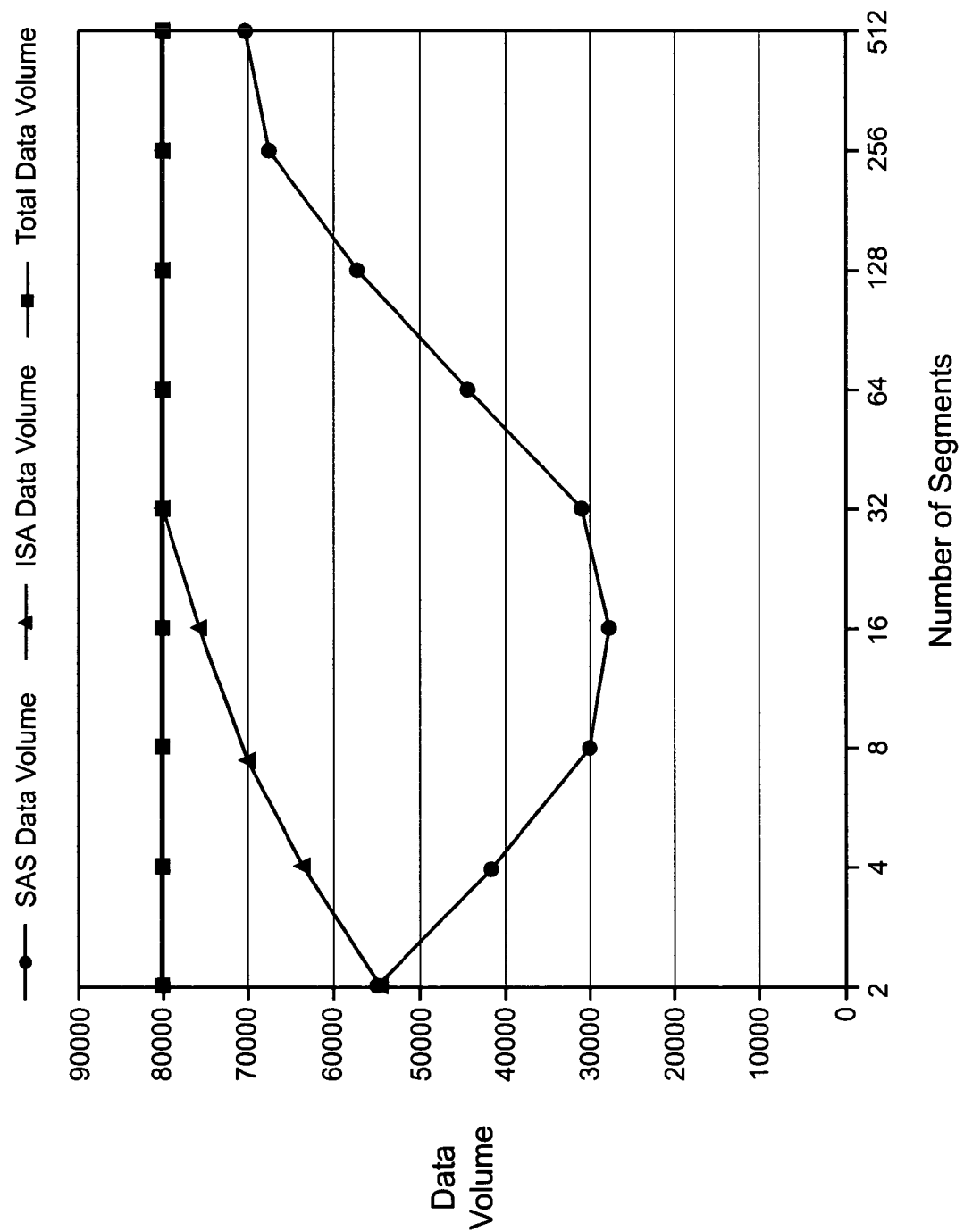
FIG._13

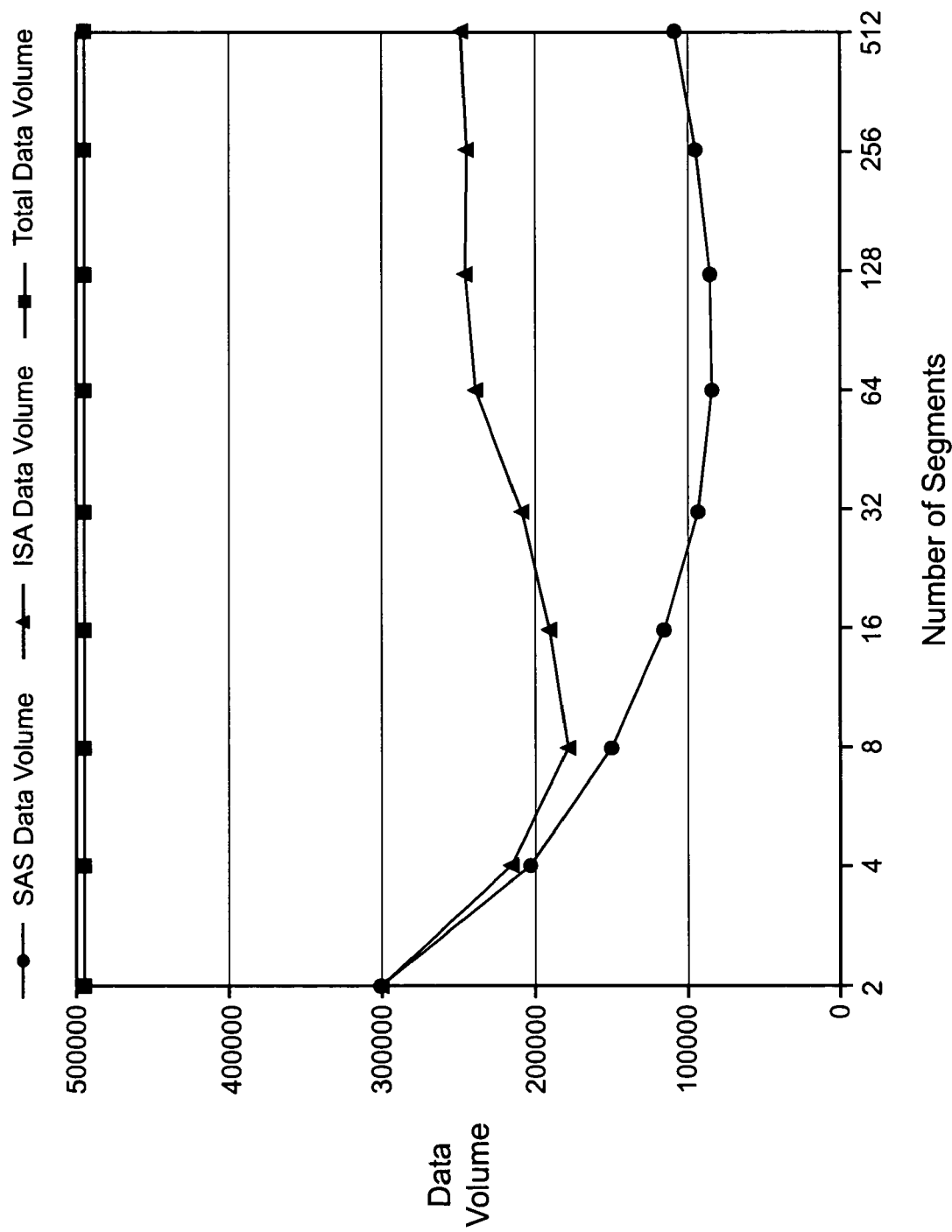
FIG._14

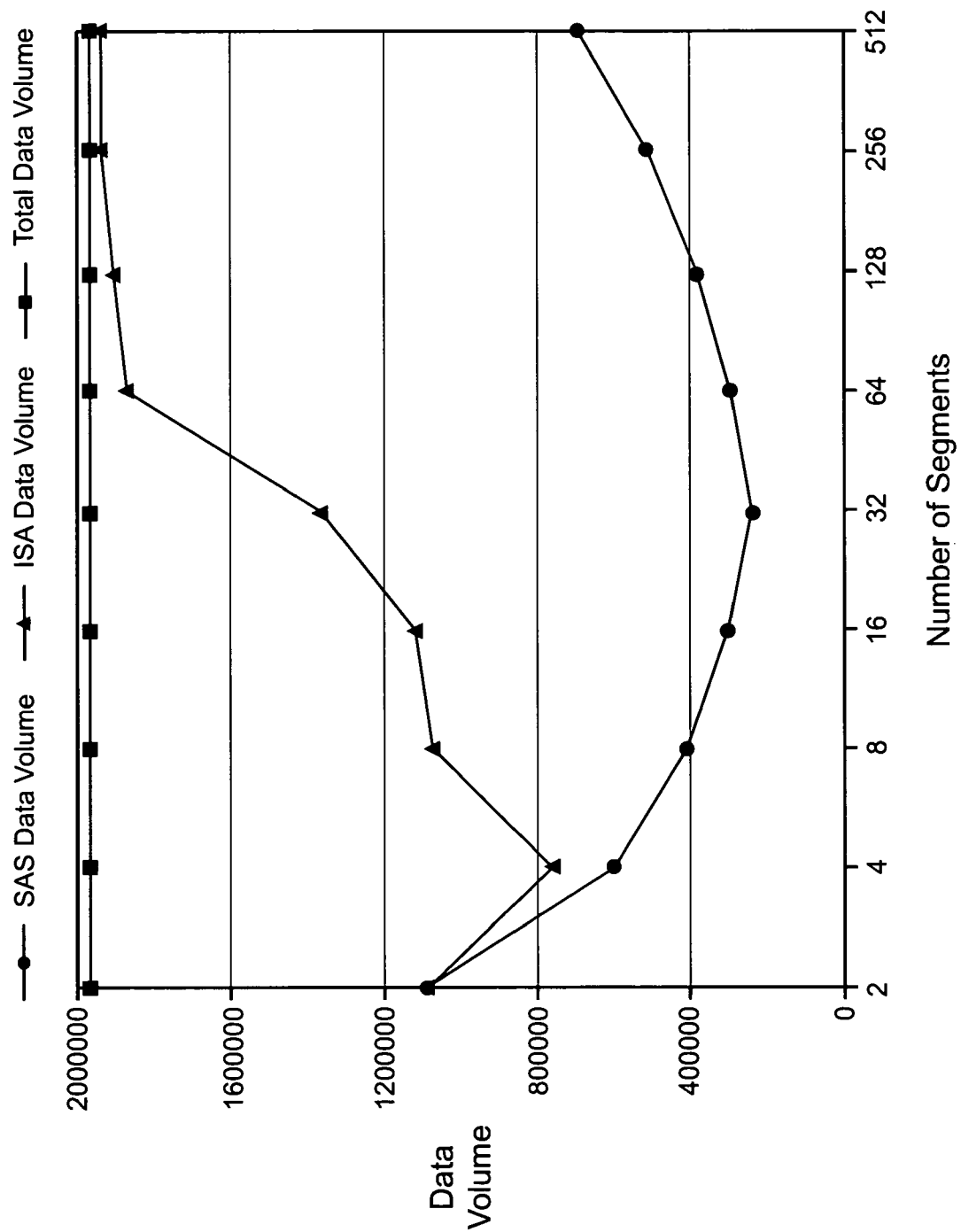
FIG._15

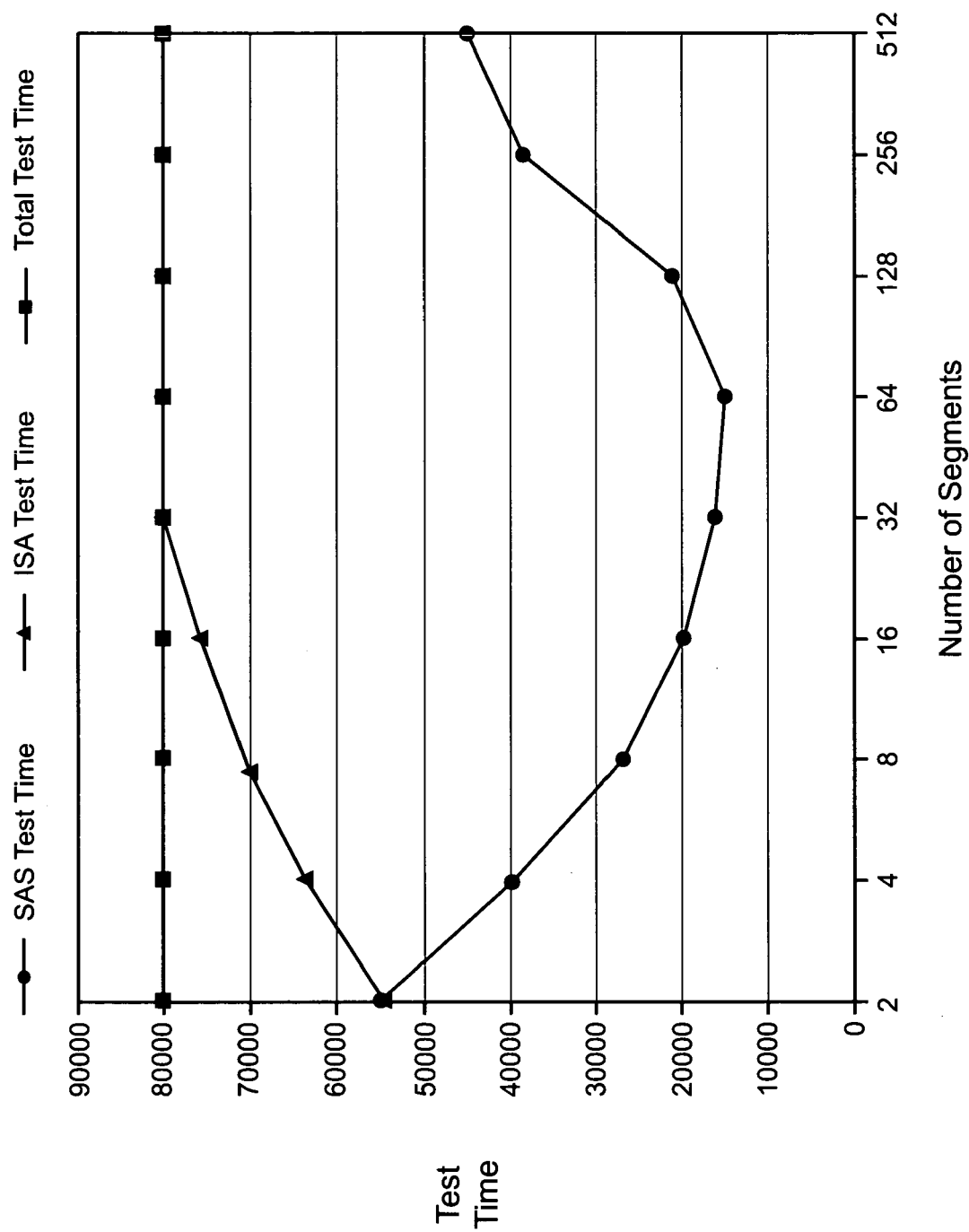
FIG._16

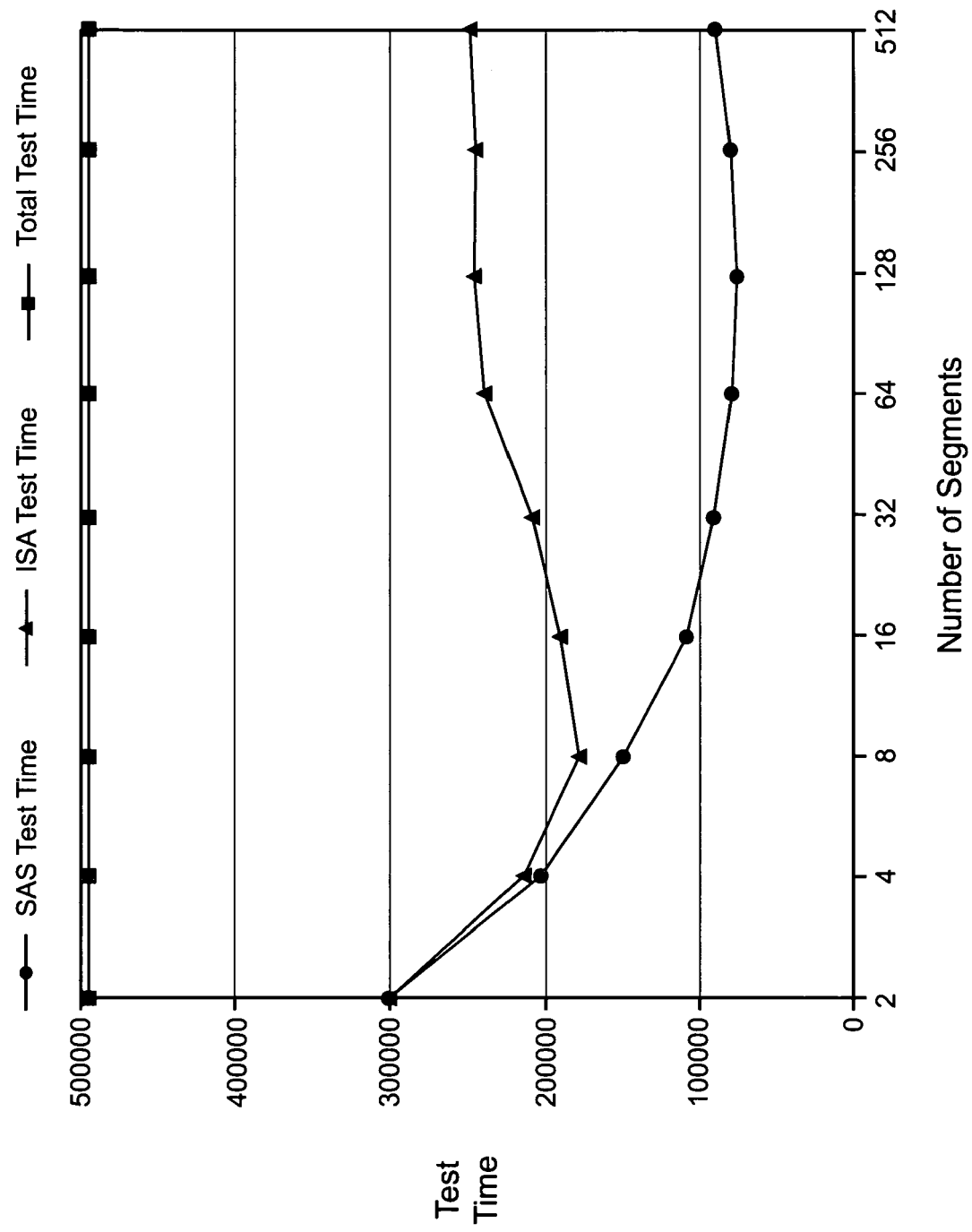
FIG._17

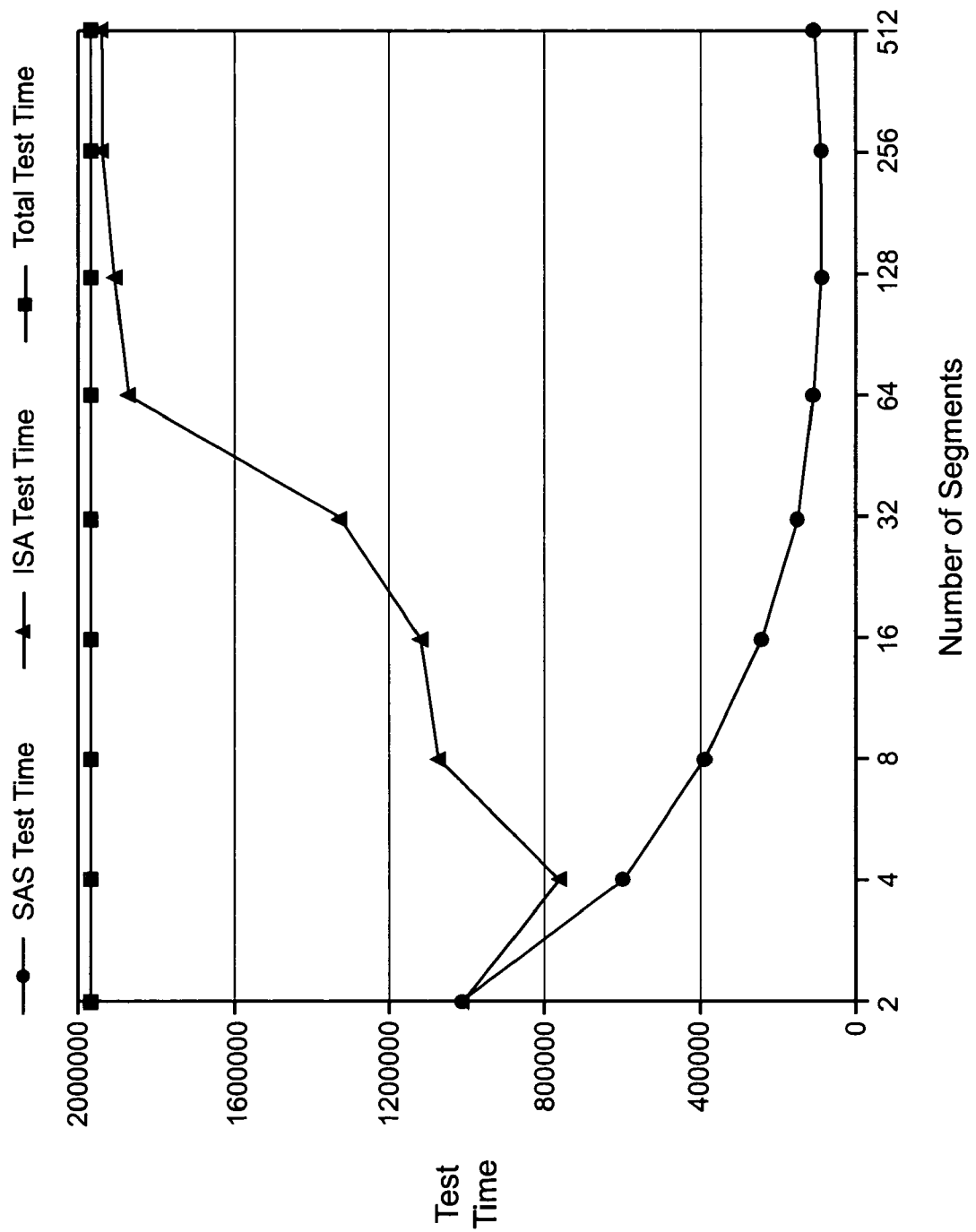
FIG._18

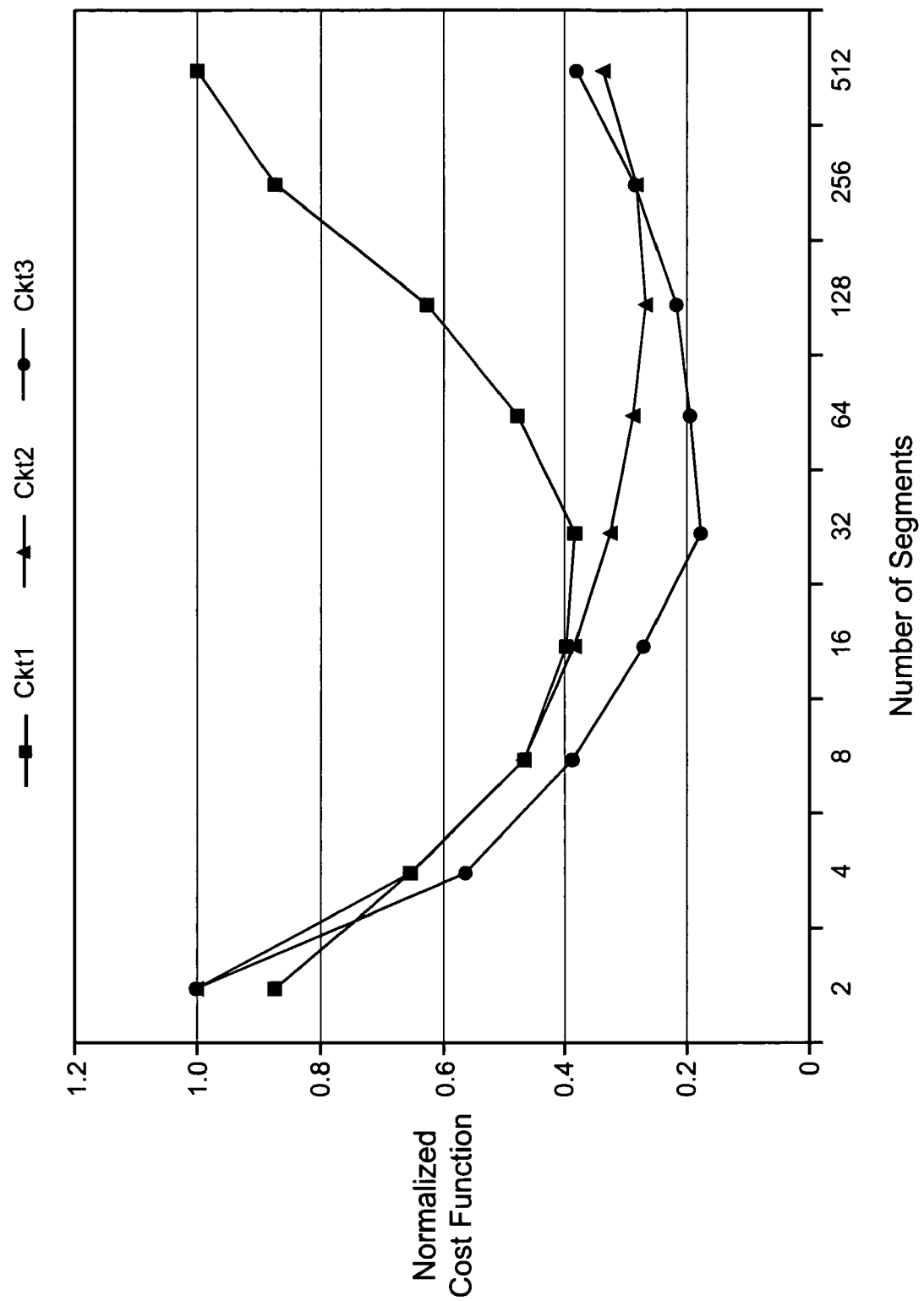
FIG._19

SEGMENTED ADDRESSABLE SCAN ARCHITECTURE AND METHOD FOR IMPLEMENTING SCAN-BASED TESTING OF INTEGRATED CIRCUITS

FIELD OF THE INVENTION

The present invention generally relates to the field of integrated circuits, particularly to a segmented addressable scan architecture and method for implementing scan-based testing of integrated circuits.

BACKGROUND OF THE INVENTION

As integrated circuits are produced with greater and greater levels of circuit density, efficient testing schemes that guarantee very high fault coverage while minimizing test costs and chip area overhead have become essential. However, as the complexity of circuits continues to increase, high fault coverage of several types of fault models becomes more difficult to achieve with traditional testing paradigms. This difficulty arises for several reasons. First, larger integrated circuits have a very high and still increasing logic-to-pin ratio that creates a test data transfer bottleneck at the chip pins. In addition, larger circuits require a prohibitively large volume of test data that must be then stored in external testing equipment. Moreover, applying the test data to a large circuit requires an increasingly long test application time. Furthermore, present external testing equipment is unable to test such larger circuits at their speed of operation.

Integrated circuits are presently tested using a number of structured design for testability (DFT) techniques. The scan-path method is a widely used DFT technique. It is based on serialization of test data (see E. J. McCluskey, *Logic Design Principles with Emphasis on Testable Semicustom Circuits*, Prentice-Hall, Englewood Cliffs, N.J., USA, 1986). In scan-based testing, the flip-flops in the circuit under test are connected together to form one or multiple scan chains. Through these scan chains, arbitrary test patterns can be shifted into the flip-flops and applied to different parts of the circuit. The main advantage of scan testing is improving the controllability and observability of the circuit under test by having direct access to the states of the flip-flops.

In scan-path methods, the circuit is designed so that it has two modes of operation: a normal functional mode and a scan mode. In the scan mode, the flip-flops in the circuit are connected as a shift register so that it is possible to shift an arbitrary test pattern into the flip-flops. By returning the circuit to the normal mode for one clock cycle, the outputs of the combinational circuitry are stored in the flip-flops. The circuit can then be placed in the scan mode to shift out the contents of the flip-flops and compare them with the correct response.

Scan-based testing of VLSI (Very Large Scale Integration) circuits is widely used due to its simplicity and the fact that it permits more thorough testing of the circuit. However, it suffers from the following four problems: (1) data volume: Every test pattern requires N bits of storage where N=number of primary inputs+number of flip-flops in the design. With hundreds of thousands of flip-flops and tens of thousands of patterns, the data volume is in Gigabits and the problem is only getting worse; (2) test time: Scanning-in a test pattern is a time consuming process. For example, if the length of the longest scan chain is 4,000 flip-flops, every test pattern needs 4,000 clock cycles to be shifted in the scan chains. Scanning the pattern is normally done at slow speed due to circuit limitations. This problem contributes significantly to the test cost since test time is a major component in that cost function; (3) power consumption: In normal operation, a small portion of the circuit is active at the same time. During scan-in and scan-out, all flip-flops are toggled to shift the pattern in and the response out. This high activity may damage the circuit. One way to deal with it is to apply the scanning at a low speed which makes test time worse; and (4) tester channels: The cost of testers is directly dependent on the number of channels it supports. A solution that would enable testing a circuit with a lower requirement on the number of tester channels should result in reduction in test cost.

Shifting a test pattern into the scan chains is a time consuming process. If the circuit has a single scan chain, shifting a test pattern takes as many clock cycles as there are flip-flops in the circuit. The stumps architecture, shown in FIG. 1, groups the flip-flops into multiple scan chains to enable loading a test pattern into the scan chains in parallel. However, it requires a tester channel per scan chain input to load the test pattern and a tester channel per scan chain output to shift out the circuit response.

Several compression techniques have been presented to reduce the data volume and the tester channel requirements. A generic architecture for such techniques is shown in FIG. 2. With such techniques, a compressed vector is loaded from the tester into the decompression circuitry, which expands the vector into a test pattern in the scan chains. The test response is also compressed into a smaller vector using the output compression circuitry. For example, compression techniques were discussed in B. Koenemann "LFSRCoded Test Patterns for Scan Designs," *European Test Conference (ETC'91)*, pp. 237–242, 1991; E. J. McCluskey, D. Burek, B. Koenemann, S. Mitra, J. Patel, J. Rajski and J. Waicukauski, "Test Data Compression," *Design & Test of Computers*, Vol. 20, No. 2, pp. 76–87, March–April 2003; A. Al-Yamani and E. J. McCluskey, "Seed Encoding for LFSRs and Cellular Automata," *40th Design Automation Conference (DAC'03)*, June 2003; and J. Rajski, J. Tyszer, M. Kassab and N. Mukherjee, "Embedded Deterministic Test," *IEEE Transactions on Computer-Aided Design (TCAD)*, Vol. 23, No. 5, pp. 776–792, May 2004. These techniques reduce the test data volume by applying linear compression techniques to the test data. These techniques rely on having a decompression circuit on the chip to decompress the data coming from the tester. This may also reduce the tester channel requirements because the test data is loaded into the decompression circuitry. However, compression schemes fail to address test time or power consumption.

Scan segmentation approaches rely on segmenting the scan chains into multiple segments. If the segments have compatible data they are loaded in parallel. If not, the data is loaded serially. Depending on chances of compatibility, these approaches may reduce test data volume, test time and tester channel requirements. However, for segmentation schemes, chances of compatibility become smaller as the number of segments increases. Thus, such schemes do not allow for taking advantage of an aggressive segmentation that would lead to shorter test time. Also, such schemes fail to address power consumption. For example, Illinois Scan Architecture (ISA) was introduced in I. Hamzaoglu and J. Patel, "Reducing Test Application Time for Full Scan Embedded Cores" *IEEE International Symposium on Fault Tolerant Computing (FTC'99)*, pp. 260–267, 1999 to reduce data volume and test application time by splitting the scan chain into multiple segments to reduce test data volume and test application time. The basic architecture for Illinois scan is shown in FIG. 3. A given scan chain is split into multiple segments. Since a majority of the bits in ATPG (Automatic Test Pattern Generation) patterns are don't-care bits, there are chances that these segments may have compatible vectors (i.e., not having opposite care-bits in one location). In this case, all segments of a given chain are configured in a broadcast mode to read the same vector. This speeds up the test vector loading time and reduces the data volume by a factor equivalent to the number of segments. When the segments within a given scan chain are incompatible, the test vector needs to be loaded serially by reconfiguring the segments into a single long scan chain. The fact that a majority of the ATPG bits (95–99%, see T. Hiraide, K. O. Boateng, H. Konishi, K. Itaya, M. Emori and H. Yamanaka, "BIST-Aided Scan Test—A New Method for Test Cost Reduction," *VLSI Test Symposium (VTS'03)*, pp. 359–364, April 2003) are don't-care bits makes ISA an attractive solution for data volume and test time.

Several enhancements to the scan architecture have been proposed and discussed for multiple reasons. Lee et al. presented a broadcasting scheme where ATPG patterns are broadcasted to multiple scan chains with a core or across multiple cores, and the broadcast mode is used when the vectors going into multiple chains are compatible (see K-J. Lee, J-J. Chen and C-H. Huang, "Broadcasting Test Patterns to Multiple Circuits," *IEEE Transactions on Computer-Aided Design (TCAD)*, Vol. 18, No. 12, pp. 1793–1802, December 1999). A token scan architecture was introduced to gate the clock to different scan segments while taking advantage of the regularity and periodicity of scan chains (see T-C. Huang and K-J. Lee, "A Token Scan Architecture for Low Power Testing," *International Test Conference (ITC'01)*, pp. 660–669, October 2001). Another scheme for selective triggering of scan segments was proposed in S. Sharifi, M. Hosseinabadi, P. Riahi and Z. Navabi, "Reducing Test Power, Time and Data Volume in SoC Testing Using Selective Trigger Scan Architecture," *International Symposium on Defect and Fault Tolerance (DFT'03)*, 2003.

A novel scheme was presented in O. Sinanoglu and A. Orailoglu, "A Novel Scan Architecture for Power-Efficient, Rapid Test," *International Conference on Computer-Aided Design (ICCAD'02)*, pp. 299–303, November 2002 to reduce test power consumption by freezing scan segments that don't have care-bits in the next test stimulus. By only loading the segments that have care-bits, data volume, application time, and test power consumption are all reduced at once. Only one segment of the scan chain is controlled and observed at a time.

A reconfigurable scheme was introduced in S. Samaranayake, E. Gizdarski, N. Sitchinava, F. Neuveux, R. Kapur and T. Williams, "A Reconfigurable Shared Scan-in Architecture," *VLSI Test Symposium (VTS'03)*, April 2003 to use mapping logic to control the connection of multiple scan chains. This increases the chances of compatibility between multiple chains and hence makes room for additional compaction.

A new scan architecture was proposed in D. Xiang, J. Sun, M. Chen and S. Gu, "Cost-Effective Scan Architecture and a Test Application Scheme for Scan Testing with Non-scan Test Power and Test Application Cost," U.S. Patent Application Publication No. 20040153978, filed Dec. 19, 2003, published Aug. 5, 2004 to order the scan cells and connect them based on their functional interaction.

A circular scan scheme was presented in A. Arslan and A. Orailoglu, "CircularScan: A Scan Architecture for Test Cost Reduction," *Design, Automation and Test in Europe Conference and Exhibition (DATE'04)*, Vol. 2, pp. 1290–1295, February 2004 to reduce test data volume. The basic concept is to use a decoder to address different scan chains at different time. This increases the number of possible scan chains ($2^{N-1}$ for an N-input decoder). Also, the output of each scan chains is reconnected to its input. This enables reusing the contents of the response captured in the chain as a new test stimulus if they are compatible.

These previous schemes are either limited in how much they can benefit from compatibility between some of the segments or fail to address the issue of power consumption during scan or both.

Another attempt for using decoder-based segmentation is available in P. Rosinger, B. M. Al-Hashimi, and N. Nicolici, "Scan Architecture With Mutually Exclusive Scan Segment Activation for Shift- and Capture-Power Reduction," *IEEE Transactions on Computer-Aided Design (TCAD)*, Vol. 23, No. 7, pp. 1142–1153, July 2004. In this scheme the clocks to various segments are controlled through a regular decoder. The main advantage of the scheme is power reduction during scan and capture. However, the solution does not address data volume, or test application time.

In general, these previous techniques that would address one of the foregoing described four problems associated with scan-based testing of VLSI circuits would normally make another problem worse or in the best case not address it.

Thus, it would be desirable to provide a scan architecture and scheme that would simultaneously address data volume, test time, power consumption, and tester channel requirements.

SUMMARY OF THE INVENTION

In an exemplary aspect, the present invention provides a method for implementing scan-based testing of integrated circuits. A scan chain is divided into a plurality of segments. For a test pattern, compatible segments of the plurality of segments are grouped into compatibility classes. All compatible segments within one of the compatibility classes are activated simultaneously to load the test pattern data.

In an additional exemplary aspect, the present invention provides a system for implementing scan-based testing of integrated circuits. The system includes means for dividing a scan chain into a plurality of segments, means for grouping compatible segments of the plurality of segments into compatibility classes for a test pattern, and means for simultaneously loading all compatible segments within one of the compatibility classes.

In another exemplary aspect, the present invention provides a segmented addressable scan (SAS) architecture, which includes M segments of a scan chain, M being a positive integer. M 2-input AND gates are communicatively coupled to a clock tree and to the M segments. A multiple-hot decoder is communicatively coupled to the 2-input AND gates for receiving an address as input and for activating at least one segment of the M segments through the 2-input AND gates based on the address.

In a further exemplary aspect, the present invention provides a segmented addressable scan (SAS) architecture, which includes a plurality of segments of a scan chain, a plurality of 2-to-1 multiplexers, an input decompressor and a multiple-hot decoder. Each of the plurality of 2-to-1 multiplexers is communicatively coupled to each of the plurality of segments. An output of a last cell in each of the plurality of segments provides a first input to each of the plurality of 2-to-1 multiplexers. The input decompressor is communicatively coupled to each of the plurality of 2-to-1 multiplexers for providing data for a test pattern to each of the plurality of 2-to-1 multiplexers as a second input. The multiple-hot decoder is communicatively coupled to each of the plurality of 2-to-1 multiplexers. The multiple-hot decoder receives at least one address as input and provides at least one output to a select line of each of the plurality of 2-to-1 multiplexers.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a schematic diagram illustrating a prior art multiple scan chains architecture;

FIG. 2 is a schematic diagram illustrating a prior art generic architecture for input and output compression;

FIG. 3 is a schematic diagram illustrating a prior art Illinois scan architecture;

FIG. 4 is a schematic diagram illustrating a segmented addressable scan (SAS) architecture in accordance with an exemplary embodiment of the present invention;

FIG. 4A is a schematic diagram illustrating a segmented addressable scan (SAS) architecture in accordance with another exemplary embodiment of the present invention;

FIG. 5 shows an exemplary 30-bit test pattern;

FIG. 6 shows that the 30-bit test pattern illustrated in FIG. 5 can be split into three compatibility classes in accordance with an exemplary embodiment of the present invention;

FIG. 7 shows an encoding scheme for address bits in accordance with an exemplary embodiment of the present invention;

FIG. 8 shows the behavior of a 2-input 4-output multiple-hot decoder in accordance with an exemplary embodiment of the present invention;

FIG. 9 shows a 2-to-4 multiple-hot decoder in accordance with an exemplary embodiment of the present invention;

FIG. 10 is a schematic block diagram of a SAS architecture with 4 segments in accordance with an exemplary embodiment of the present invention;

FIG. 10A is a schematic block diagram of a SAS architecture with 8 segments in accordance with an exemplary embodiment of the present invention;

FIG. 10B is a schematic block diagram of a SAS architecture with 8 segments in accordance with an additional exemplary embodiment of the present invention;

FIG. 11 is a schematic diagram illustrating the number of transistors needed for SAS architecture with different segmentation options (worst case estimate) in accordance with an exemplary embodiment of the present invention;

FIG. 12 describes characteristics of three exemplary circuits Ckt1, Ckt2 and Ckt3;

FIG. 13 is a schematic diagram illustrating data volume requirements for the circuit Ckt1 described in FIG. 12 in accordance with an exemplary embodiment of the present invention;

FIG. 14 is a schematic diagram illustrating data volume requirements for the circuit Ckt2 described in FIG. 12 in accordance with an exemplary embodiment of the present invention;

FIG. 15 is a schematic diagram illustrating data volume requirements for the circuit Ckt3 described in FIG. 12 in accordance with an exemplary embodiment of the present invention;

FIG. 16 is a schematic diagram illustrating test time for the circuit Ckt1 described in FIG. 12 in accordance with an exemplary embodiment of the present invention;

FIG. 17 is a schematic diagram illustrating test time for the circuit Ckt2 described in FIG. 12 in accordance with an exemplary embodiment of the present invention;

FIG. 18 is a schematic diagram illustrating test time for the circuit Ckt3 described in FIG. 12 in accordance with an exemplary embodiment of the present invention; and FIG. 19 is a schematic diagram illustrating cost function for the circuits Ckt1, Ckt2 and Ckt3 described in FIG. 12 in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

The present invention provides a test architecture that addresses multiple problems faced in digital IC (Integrated Circuit) testing. These problems are test data volume, test application time, test power consumption, and tester channel requirements. With minimal hardware overhead, the present architecture may provide at least an order of magnitude reduction to each of the above problems. The present invention may significantly reduce test data volume and test application time with segmented scan architectures by enabling many different compatibility configurations among multiple segments. The present architecture may also reduce test power consumption and tester channel requirements.

The present architecture may enhance benefit from all scan segmentation schemes by avoiding the limitation of having to have all segments compatible to benefit from the segmentation. In other words, any combination of segments may be compatible to lead to reduction in the test stimuli loaded. This is done with minimal overhead due to a multiple-hot decoder explained in detail later. The scheme may simultaneously address data volume, test time, power, and tester channel requirements.

The SAS (Segmented Addressable Scan) architecture of the present invention is based on segmenting the scan chain into multiple segments. For a given test pattern, compatible segments are grouped together into compatibility classes. A multiple-hot decoder is used to select all compatible segments within a given compatibility class. For a compatibility class, a given address is loaded into the multiple-hot decoder to refer to a single or multiple segments. The simultaneous loading of compatible segments may allow the SAS architecture to benefit from the compatibility between the segments even when not all segments are compatible. One way for the multiple-hot decoder to activate/deactivate the segments is by gating the clock that controls those segments (see FIGS. 4 and 10). Another way is to use a 2-to-1 multiplexer at the input to each segment (see FIG. 4A). As shown in FIG. 4A, one of the inputs to the multiplexer comes from the tester (or the decompressor). The other input comes from the output of the last cell in the segment. The select line to the multiplexer comes from the multiple-hot decoder. If the segment is selected, the data is loaded externally. If the segment is not selected, the same segment data is reloaded to the same flip-flops. This multiplexer based solution avoids gating the clock which in some designs may create physical design challenges. A regular one-hot decoder may take advantage of partial compatibility for data volume reduction only. The multiple-hot decoder used in the SAS architecture reduces test time also based on this compatibility since the compatibility classes are loaded in parallel.

The implementation of the multiple-hot decoder is achieved through encoding the values 0, 1 and d (don't-care) in the input to the decoder. Due to encoding the don't-care values, the decoder may activate multiple segments. The decoder is implemented by: (a) choosing codes for 0, 1, and d (e.g. 0=01, 1=10 and d=11), and if the decoder receives an address that includes a don't-care bit, it activates all segments for which this don't-care bit is a 1 or a 0; and (b) the function is tabulated based on the encoding, and the decoder hardware is implemented based on this function.

According to the present invention, multiple segments may be loaded simultaneously while maintaining the freedom of deciding which segments are grouped together for a given test pattern. Such reconfiguration of compatibility allows for significant additional compaction, thereby leading to gains in data volume. It also enables aggressive parallelization of the scan chains, resulting in reduction in test application time. Moreover, the compatible segments may be loaded in parallel using a multiple-hot decoder instead of loading them serially, and this further reduces the time required to load the scan chains. Further, the segments that are not loaded within a given round may be not clocked, resulting in power savings which in turn allows for faster clocking of the test patterns within the same power budget.

The SAS architecture has the following distinguishing features. First, multiple segments can be loaded simultaneously while maintaining the freedom of selecting which segments are grouped together within a give test pattern. Unlike the technique in S. Samaranayake, E. Gizdarski, N. Sitchinava, F. Neuveux, R. Kapur and T. Williams, "A Reconfigurable Shared Scan-in Architecture," *VLSI Test Symposium* (*VTS'03*), April 2003, this is done without additional mapping logic. Such reconfiguration of compatibility allows for significant additional compaction, leading to gains in data volume. It also enables aggressive parallelization of the scan chains leading to reduction in test application time. Additionally, the compatible segments are loaded in parallel using a multiple-hot decoder (explained in detail below) instead of loading them serially, and this further reduces the time required to load the scan chains. For most of the previous schemes, if only a subset of the segments satisfies compatibility, that subset cannot be loaded in parallel. The scheme in S. Samaranayake, E. Gizdarski, N. Sitchinava, F. Neuveux, R. Kapur and T. Williams, "A Reconfigurable Shared Scan-in Architecture," *VLSI Test Symposium* (*VTS'03*), April 2003 allowed for subsets of segments to be loaded in parallel. However, it allowed that through logic mapping hardware. Such hardware is very inflexible compared to SAS architecture in terms of grouping different subsets of segments for each pattern. SAS architecture with S segments allows for $3^{\lceil \log_2 S \rceil}$ different configurations inherently while the technique mentioned above requires a multiplexer with $3^{\lceil \log_2 S \rceil}$ inputs per scan segment for the same level of flexibility. Moreover, the segments that are not loaded within a given round are not clocked, resulting in power savings which in turn allows for faster clocking of the test patterns within the same power budget.

The basic blocks of an exemplary SAS architecture 400 are shown in FIG. 4. The architecture 400 may be implemented with a single decoder for the entire design or multiple decoders for multiple scan chains. The multiple-hot decoder (MHD) 402 is used to activate all compatible segments within a given compatibility class. A given address is loaded into the MHD to refer to a single or multiple segments. The multiple activations of compatible segments allow the architecture 400 to benefit from the compatibility between the segments even when not all segments are compatible. This gives a significant advantage over previous segmentation techniques. The SAS architecture 400 includes M segments 401 of a scan chain, M being a positive integer. M 2-input AND gates 404 are communicatively coupled to a clock tree 406 and to the segments 401. The multiple-hot decoder 402 is communicatively coupled to the 2-input AND gates 404 for receiving an address 408 as input and for activating at least one segment of the segments 401 through the 2-input AND gates 404 based on the address 408. The SAS architecture 400 may include a tester channel or input decompressor 410 for providing at least one test pattern to the segments 401 and an output compressor 412 for compressing output received from the segments 401. FIG. 4A shows another exemplary SAS architecture where the AND gates shown in FIG. 4 are replaced with 2-to-1 multiplexers to avoid gating the clock. This way the selected segments may be loaded externally and the unselected segments may be reloaded with their existing values.

The 30-bit test pattern shown in FIG. 5 may be used as an example. The scan cells are assumed to be segmented into 6 5-bit segments as shown in FIG. 5, where X indicates a don't-care bit. If a regular segmentation scheme (e.g., ISA) is applied to the pattern, one may not be able to take advantage of partial compatibilities between segments. In other words, one may have to store and scan in the entire 30 bits. However, because of the present segmentation scheme, the pattern shown in FIG. 5 may be split into 3 compatibility classes as shown in FIG. 6. A regular decoder scheme like the ones in A. Arslan and A. Orailoglu, "CircularScan: A Scan Architecture for Test Cost Reduction," *Design, Automation and Test in Europe Conference and Exhibition* (*DATE'04*), Vol. 2, pp. 1290–1295, February 2004 and P. Rosinger, B. M. Al-Hashimi, and N. Nicolici, "Scan Architecture With Mutually Exclusive Scan Segment Activation for Shift- and Capture-Power Reduction," *IEEE Transactions on Computer-Aided Design* (*TCAD*), Vol. 23, No. 7, pp. 1142–1153, July 2004 would take advantage of the above compatibility for data volume reduction only. Because of the MHD used in the SAS architecture, test time may also be optimized based on this compatibility since the compatibility classes are to be loaded in parallel.

Referring back to FIG. 4, the multiple-hot decoder 402 may take the address of the segment(s) to be enabled and activate the clocks to those segments through the clock gating AND gates 404. For regular one-hot decoders, the input is an address of the selected output. However, for the SAS multiple-hot decoder 402, the address may include don't-care bits (d's), allowing multiple outputs to be activated. For the example shown in FIG. 6, compatibility class 1 may be loaded in parallel by combining the addresses of Segment 1 and Segment 5 {001, 101}, which means that the address for this class is d01. The address for class 2 is 01d, and the address for class 3 is 1d0. For the multiple-hot decoder 402, don't-care bits in the address need to be encoded too. The positional cube notation described in G. De Micheli, *Synthesis and Optimization of Digital Circuits*, McGraw-Hill, 1994 may be used to encode 0s, 1s and don't-cares as shown in FIG. 7. The positional cube encoding scheme may result in an implementation for the multiple-hot decoder 402 that requires the same hardware as a regular one-hot address decoder.

FIG. 8 shows an example for the implementation of a 4-input 4-output multiple-hot decoder in accordance with an exemplary aspect of the present invention. The function shown in FIG. 8 may be implemented with 4 2-input AND gates as shown in FIG. 9. This is exactly the same hardware needed for a 2-input one-hot decoder. Similarly, for 8 segments, 8 3-input AND gates may be used. In general, if there are M segments, M AND gates each with $[\log_2 M]$ inputs for the multiple-hot decoder may be used. For clock gating, additional M 2-input AND gates may be used. Alternatively, instead of M AND gates each with $[\log_2 M]$ inputs, M+O(M) standard 2-input AND gates may be used. For example, if M=8 and 2 $[\log_2 8]$=6 inputs are provided, one may use 12 2-input AND gates instead of 8 3-input AND gates (see FIGS. 10A and 10B). Similarly, if 256 segments are provided, one may use 256+2*16+4*4=304 2-input gates instead of 256 8-input gates. In general, the sum may be in the form of $M+2\sqrt{M}+4\sqrt{\sqrt{M}}+8\sqrt{\sqrt{\sqrt{M}}}+\ldots$.

The address for a given compatibility class can be loaded in parallel from the tester in which case the number of tester channels needed is 2 $[\log_2 M]$+1 (the multiplication by 2 is a result of encoding 3 values 0, 1, and d). It can also be loaded serially. While shifting in a test pattern for one compatibility class, the address for the next compatibility class can be loaded into a shadow register. The total number of flip-flops for the shadow register is 2 $[\log_2 M]$. The block diagram for a SAS architecture 1000 with 4 segments and serial loading of address register is shown in FIG. 10 (see FIG. 10A for 8 segments). The decoder and the register hardware overhead are minimal even with very aggressive segmentation. The size of the multiple-hot decoder, the clock gating circuitry, the address register and the shadow registers for different segmentation options may be calculated, and FIG. 11 shows the resulting worst-case number of transistors, i.e., without any logic optimization. FIG. 10A is a schematic block diagram of a SAS architecture with 8 segments in accordance with an exemplary embodiment of the present invention. Those of ordinary skill in the art will understand that many logic minimization algorithms may be applied to the SAS decoder logic together with the clock gating logic without departing from the scope and spirit of the present invention. It is understood that the number of transistors may be reduced as described above. Classical logic minimization techniques may be used to reduce the total number of transistors needed.

SAS simulations have been applied to three different circuits whose characteristics are shown in FIG. 12. The test patterns were generated and maximally compacted using a commercial ATPG tool. For the experiments, simple ISA architecture and the present SAS architecture with different segmentation options are applied. The data volume requirements for both techniques and for the regular scan based testing are illustrated in FIG. 13, FIG. 14 and FIG. 15, respectively, for these three circuits shown in FIG. 12. In FIGS. 13 through 15, the regular scan data volume is referred to as the total data volume since it represents an upper bound. The three options are also compared in terms of test time and the results are shown in FIGS. 16 through 18. The total test time in FIGS. 16 through 18 represents loading all scan cells and primary inputs serially since that represents an upper bound on shifting the test patterns.

A user of the present scheme needs to select the number of segments. For selecting a certain segmentation over the others, a cost function has to be evaluated in terms of all variables (data volume, test time, and hardware overhead). The following is a general form for such a cost function:

$$\text{Cost} = C_t \cdot \text{time} + C_d \cdot \text{data} + C_h \cdot \text{hardware}$$

where $C_t$, $C_d$, and $C_h$ are the weights for test time, data volume and hardware overhead, respectively. The user controls these weights based on the importance of one factor over the others.

As an example, the same weight for a clock cycle, a storage bit and a transistor is used to evaluate the cost function for given test time, data volume and hardware overhead. The normalized cost function for different segmentations for the three circuits shown in FIG. 12 is illustrated in FIG. 19. The normalization is based on the maximum cost for each circuit. A quick observation of the cost function curves indicates that when the circuit gets larger, the optimal number of segments increases, which allows for better optimization of test time, data volume and tester channels.

According to one aspect of the present invention, there are two important algorithms for SAS: one is for test data preparation, and the other is for test application. The test generation algorithm is as follows. A can chain is divided into a plurality of segments. Given a set of test patterns generated for these segments, for each test pattern compatible segments of the plurality of segments are grouped into compatibility classes. One or more addresses are generated for every compatibility class within the test pattern by grouping segments within the compatibility class into groups that can be addressed in parallel with a single address. The addresses generated are preferably such that they address the largest number of compatible segments and there is no overlap between the segments activated in parallel within the same test pattern. The test application algorithm is as follows. For every address within the compatibility class, the address is loaded into a SAS multiple-hot decoder, and compatibility class data is loaded into the segments activated by the address while the response to the previous test pattern from the activated segments is shifted out. This is repeated for every compatibility class within a test pattern. The same test pattern is applied by deactivating the scan enable signal and clocking the circuit one or multiple times depending on the test type. This test application algorithm is repeated for every test pattern. Both algorithms are shown below:

I. Test Data Preparation Algorithm:
1. Divide the scan chains into a plurality of segments;
2. Given a set of test patterns generated for these segments, for each test pattern, group compatible segments of the plurality of segments into compatibility classes; and
3. Generate one or more addresses for every compatibility class within the test pattern by grouping segments within the compatibility class into groups that can be addressed in parallel with a single address. The addresses generated should be such that they address the largest number of compatible segments and there is no overlap between the segments activated in parallel within the same test pattern.

II. Test Application Algorithm:
1. Repeat the following for every test pattern:
   1.1. Repeat the following for every compatibility class within the pattern:
      1.1.1. Repeat the following for every address within the compatibility class:

1.1.1.1. Load the address into the SAS multiple-hot decoder; and 1.1.1.2. Load the compatibility class data into the segments activated by the address while shifting out the response to the previous test pattern from the activated segments.

1.2. Apply the test pattern by deactivating the scan enable signal and clocking the circuit one or multiple times depending on the test type.

According to one aspect of the present invention, the SAS architecture may be combined with existing compression techniques to further reduce data volume. The data may be loaded from the tester to the decompression circuitry and from there to the scan segments. In addition, a shadow register may be used to load the address of the compatibility class from the tester in advance. This may reduce the tester channel requirement without sacrificing test time. Moreover, the multiple-hot decoder may be implemented differently in hardware, but the basic idea is to have it activate multiple segments at the same time and not activate the other segments by controlling the clocks. Also, the selection of segments to be loaded with test vectors can be done either through clock gating or through multiplexing the input to these segments.

The present invention may simultaneously solve test problems that the industry is facing today and may have the following advantages. First, as shown by the foregoing-described experiments, it reduces the data volume significantly and can be combined with other compression or reseeding techniques for further reduction. Moreover, it also solves the test time problem by allowing very aggressive segmentation without requiring additional test channels and also by allowing parallel loading of compatibility classes. Additionally, it also solves the tester channel problem by reducing the number of pins required to logarithm the number of scan chains. Further, it reduces the power consumption during test application by selectively activating the segments that need to be loaded and not clocking the other segments. In addition, it provides solutions for all the above problems with very minimal hardware and routing overhead.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for implementing scan-based testing of integrated circuits, comprising:
  dividing a scan chain into a plurality of segments;
  grouping, for a test pattern, compatible segments of said plurality of segments into at least one compatibility class; and
  simultaneously loading all compatible segments within one of said at least one compatibility class with data for said test pattern through selective activation.

2. The method of claim 1, wherein said selective activation is implemented by a multiple-hot decoder.

3. The method of claim 2, wherein for said one of said at least one compatibility class, an address is loaded into said multiple-hot decoder as input to refer to a single segment or multiple segments within said one of said at least one compatibility class.

4. The method of claim 3, wherein said address includes bits selected from the group consisting of 0, 1 and a don't-care bit.

5. The method of claim 4, wherein said bits of said address are encoded using positional cube notation.

6. The method of claim 5, wherein said bits of said address are encoded as follows: bit 0 is encoded as 10, bit 1 is encoded as 01, and said don't-care bit is encoded as 11.

7. The method of claim 2, wherein said multiple-hot decoder is suitable for at least one of activating or deactivating said all compatible segments by gating a clock that controls said all compatible segments or using at least one 2-to-1 multiplexer.

8. The method of claim 1, further comprises loading at least one address for said one of said at least one compatibility class in parallel.

9. A system for implementing scan-based testing of integrated circuits, comprising:
  means for dividing a scan chain into a plurality of segments;
  means for grouping compatible segments of said plurality of segments into at least one compatibility class for a test pattern; and
  means for simultaneously loading all compatible segments within one of said at least one compatibility class with data for said test pattern through selective activation.

10. The system of claim 9, wherein said means for simultaneously loading includes a multiple-hot decoder.

11. The system of claim 10, wherein for said one of said at least one compatibility class, an address is loaded into said multiple-hot decoder as input to refer to a single segment or multiple segments within said one of said at least one compatibility class.

12. The system of claim 11, wherein said address includes bits selected from the group consisting of 0, 1 and a don't-care bit.

13. The system of claim 12, wherein said bits of said address are encoded using positional cube notation.

14. The system of claim 10, wherein said multiple-hot decoder is suitable for at least one of activating or deactivating said all compatible segments by gating a clock that controls said all compatible segments or using at least one 2-to-1 multiplexer.

15. The system of claim 9, further comprises means for loading at least one address for said one of said at least one compatibility class in parallel.

16. A segmented addressable scan architecture for implementing scan-based testing of integrated circuits, comprising:
  a plurality of segments of a scan chain, a number of said plurality of segments being M, M being a positive integer;
  a plurality of 2-input AND gates communicatively coupled to a clock tree and to said plurality of segments, a number of said plurality of 2-input AND gates being said M; and a multiple-hot decoder, communicatively coupled to said plurality of 2-input AND gates, for receiving at least one address as input and activating at least one segment of said plurality of segments through said plurality of 2-input AND gates based on said at least one address.

17. The segmented addressable scan architecture of claim 16, further comprises an output compressor for compressing output received from said plurality of segments.

18. The segmented addressable scan architecture of claim 16, further comprises an input decompressor for providing data for a test pattern to said plurality of segments.

19. The segmented addressable scan architecture of claim 18, wherein for a test pattern, compatible segments of said plurality of segments are grouped into compatibility classes, and all compatible segments within one of said compatibility classes are simultaneously loaded based on said address received by said multiple-hot decoder.

20. The segmented addressable scan architecture of claim 16, wherein said multiple-hot decoder includes M AND gates, each of said M AND gates having $[\log_2 M]$ inputs.

21. A segmented addressable scan architecture for implementing scan-based testing of integrated circuits, comprising:
a plurality of segments of a scan chain;
a plurality of 2-to-1 multiplexers, each of said plurality of 2-to-1 multiplexers being communicatively coupled to each of said plurality of segments, an output of a last cell in said each of said plurality of segments providing a first input to said each of said plurality of 2-to-1 multiplexers;
an input decompressor, communicatively coupled to said each of said plurality of 2-to-1 multiplexers, for providing data for a test pattern to said each of said plurality of 2-to-1 multiplexers as a second input; and
a multiple-hot decoder, communicatively coupled to said each of said plurality of 2-to-1 multiplexers, for receiving at least one address as input and providing at least one output to a select line of said each of said plurality of 2-to-1 multiplexers.

22. The segmented addressable scan architecture of claim 21, further comprises an output compressor for compressing output received from said plurality of segments.

23. The segmented addressable scan architecture of claim 21, wherein when one of said plurality of segments is selected, data for said one of said plurality of segments is loaded externally.

24. The segmented addressable scan architecture of claim 21, wherein when one of said plurality of segments is not selected, existing data for said one of said plurality of segments is reloaded.

* * * * *